US006483275B1

(12) United States Patent
Nebrigic et al.

(10) Patent No.: US 6,483,275 B1
(45) Date of Patent: Nov. 19, 2002

(54) CONSUMER BATTERY HAVING A BUILT-IN INDICATOR

(75) Inventors: Dragan Danilo Nebrigic, Indian Springs, OH (US); Vladimir Gartstein, Cincinnati, OH (US)

(73) Assignee: The Board of Trustees of the Univesity of Illinois, Chicago, IL (US)

(*) Notice: Subject to any disclaimer, the term of this patent is extended or adjusted under 35 U.S.C. 154(b) by 0 days.

(21) Appl. No.: 09/298,804

(22) Filed: Apr. 23, 1999

(51) Int. Cl.[7] ............... H02J 7/00; G01N 27/416
(52) U.S. Cl. ............... 320/135; 320/107; 320/112; 340/636; 324/426
(58) Field of Search ............... 320/107, 112, 320/135, 136; 324/426, 427, 433; 429/90, 91, 92, 93; 340/636

(56) References Cited

U.S. PATENT DOCUMENTS

| | | | | |
|---|---|---|---|---|
| 3,660,759 A | * | 5/1972 | Parmeter | 324/429 |
| 3,992,228 A | | 11/1976 | Depoix | 429/90 |
| 4,289,836 A | | 9/1981 | Lemelson | |
| 4,702,563 A | | 10/1987 | Parker | 350/351 |
| 4,702,564 A | | 10/1987 | Parker | 350/351 |
| 4,716,354 A | | 12/1987 | Hacker | |
| 4,910,630 A | | 3/1990 | Kastner et al. | 361/87 |
| 4,962,347 A | | 10/1990 | Burroughs et al. | 320/48 |
| 5,015,544 A | | 5/1991 | Burroughs et al. | 429/93 |
| 5,032,825 A | | 7/1991 | Kuznicki | |
| 5,156,931 A | | 10/1992 | Burroughs et al. | 429/93 |
| 5,188,869 A | | 2/1993 | Getz et al. | 427/242 |
| 5,206,097 A | | 4/1993 | Burns et al. | 429/90 |
| 5,216,371 A | | 6/1993 | Nagai | 324/428 |
| 5,223,003 A | | 6/1993 | Tucholski et al. | 29/623.4 |
| 5,248,929 A | | 9/1993 | Burke | 320/48 |
| 5,250,905 A | | 10/1993 | Kuo et al. | 324/435 |
| 5,389,458 A | | 2/1995 | Weiss et al. | 429/90 |
| 5,458,992 A | * | 10/1995 | Bailey | 429/93 |
| 5,464,709 A | | 11/1995 | Getz et al. | 429/229 |
| 5,478,665 A | | 12/1995 | Burroughs et al. | 429/90 |
| 5,491,038 A | | 2/1996 | DePalma et al. | 429/91 |
| 5,494,496 A | | 2/1996 | Huhndorff et al. | 29/623.5 |
| 5,537,024 A | | 7/1996 | Lang | 320/48 |

(List continued on next page.)

FOREIGN PATENT DOCUMENTS

| | | | |
|---|---|---|---|
| JP | 04-108416 | * | 4/1992 |
| JP | 7249433 | | 9/1995 |
| WO | WO 9214274 | | 8/1992 |
| WO | WO 9905745 | | 2/1999 |
| WO | WO 9952163 | | 10/1999 |

OTHER PUBLICATIONS

David Heacock and David Freeman; Proceedings of the Tenth Anuual Battery Conference on Applications and Advances, Jan. 10–13, 1995.

Primary Examiner—Gregory J. Toatley, Jr.
(74) Attorney, Agent, or Firm—Welsh & Katz, LTD.

(57) ABSTRACT

A built-in battery integrated circuit (50) in the form of a flexible circuit board (70) of a consumer battery (10) senses a voltaic cell electrode (32", 34") voltage, and when the voltage is indicative of a low state of charge, activates an indicating system (11), alerting a user to the impending battery failure. In addition, a tester actuator button (15) is placed exteriorly on the battery container (12) to manually activate the indicating system (11) to verify that the battery has not become so low of charge as to prevent the indicating system from functioning. Advantageously, the tester actuator button (15) may further enable the built-in battery integrated circuit, thus having all internal electronics unpowered until a user decides to use the battery (10). The indicating system (11) includes an analog indicator such as a bargraph and/or a pulse indicator (64) such as an LED or LCD.

28 Claims, 8 Drawing Sheets

U.S. PATENT DOCUMENTS

| | | |
|---|---|---|
| 5,541,489 A | 7/1996 | Dunstan |
| 5,541,490 A | 7/1996 | Sengupta et al. |
| 5,557,188 A | 9/1996 | Piercey |
| 5,565,759 A | 10/1996 | Dunstan |
| 5,596,278 A | 1/1997 | Lin .......................... 324/435 |
| 5,600,230 A | 2/1997 | Dunstan |
| 5,606,242 A | 2/1997 | Hull et al. ................. 320/48 |
| 5,607,790 A | 3/1997 | Hughen et al. ............ 429/93 |
| 5,645,949 A | 7/1997 | Young ........................ 429/7 |
| 5,654,640 A | 8/1997 | Bailey ..................... 324/435 |
| 5,731,686 A | 3/1998 | Malhi ....................... 320/35 |
| 5,737,114 A | 4/1998 | Bailey ..................... 359/268 |
| 5,747,189 A * | 5/1998 | Perkins ..................... 429/91 |
| 5,760,588 A * | 6/1998 | Bailey ..................... 324/435 |
| 5,789,100 A | 8/1998 | Burroughs et al. ........ 429/90 |
| 5,825,156 A | 10/1998 | Patillion et al. |
| 5,841,285 A | 11/1998 | Bailey ..................... 324/435 |
| 5,849,046 A | 12/1998 | Bailey .................... 29/623.5 |
| 5,856,040 A | 1/1999 | Newman et al. .......... 429/165 |
| 5,990,664 A * | 11/1999 | Rahman ................... 320/136 |
| 5,999,410 A * | 12/1999 | Weiler ..................... 361/749 |

\* cited by examiner

CONSUMER BATTERY HAVING A BUILT-IN INDICATOR

CROSS REFERENCE TO RELATED PENDING APPLICATIONS

This application is related to the following co-pending and commonly owned applications all filed on Apr. 2, 1998: U.S. Ser. No. 09/054,192, entitled PRIMARY BATTERY HAVING A BUILT-IN CONTROLLER TO EXTEND BATTERY RUN TIME, naming Vladimir Gartstein and Dragan D. Nebrigic; U.S. Ser. No. 09/054,191, entitled BATTERY HAVING A BUILT-IN CONTROLLER TO EXTEND BATTERY SERVICE RUN TIME naming Vladimir Gartstein and Dragan D. Nebrigic; U.S. Ser. No. 09/054,087, ENTITLED BATTERY HAVING A BUILT-IN CONTROLLER, naming Vladimir Gartstein and Dragan D. Nebrigic; and U.S. Provisional Application Serial No. 60/080,427, entitled BATTERY HAVING A BUILT-IN CONTROLLER TO EXTEND BATTERY SERVICE RUN TIME, naming Dragan D. Nebrigic and Vladimir Gartstein. All of the aforementioned applications are hereby incorporated by reference in their entirety.

FIELD OF THE INVENTION

The present invention pertains to batteries, and more particularly to batteries having a built-in indicator to communicate battery state of charge.

BACKGROUND OF THE INVENTION

Consumers use batteries in many applications, such as portable electronic devices including radios, flashlights, clocks, compact disc players, cameras, cellular phones, electronic games, toys, pagers, computer devices, etc. Operation of such devices requires having sufficiently charged batteries in the device or available replacements. Inexpensive electronic devices typically give no indication of the remaining life in the batteries. Thus, the consumer generally has no warning of impending battery failure before the device stops operating.

Consumer batteries are generally used in such devices, consumer batteries being characterized as having a standard size and nominal terminal voltage and being relatively inexpensive. Examples of consumer batteries include batteries typically designated as an AAAA, AAA, AA, C, D, prismatic 9 V battery, and may further include larger batteries generally used in vehicles. A characteristic of consumer batteries is that they are generally designed for a broad range of devices rather than for a specific device.

Some consumer batteries provide simple thermo-chromatic labels for testing battery state of charge. However, such built-in battery testers have a number of disadvantages. First, thermo-chromatic labels are limited in accuracy, sometimes being as much as twenty percent off the state of charge of the battery due to factors such as manufacturing variability and temperature of the battery. Second, thermo-chromatic labels dissipate significant amounts of energy and are thus made to only provide an indication when manually activated by the consumer pressing the label. Thus, the consumer cannot readily inspect a battery but must undergo the inconvenience of removing a battery from its packaging or from a device and firmly press the thermochromatic label for a period of time.

More complex battery management functions have been developed for use in battery-powered electronic devices. For example, video camcorders and portable personal computers typically give a warning of impending shutdown due to a discharged battery, and may even estimate time remaining on the battery. However, such indication functions are relatively costly and complex electronic circuits that can add significantly to the cost to the electronic device. For example, the cost of a low performance microprocessor generally used in such circuits would be generally cost prohibitive in consumer batteries, as well as for inclusion in many inexpensive battery-powered devices. In addition, such circuits generally are applicable to only one type of battery, are too large to incorporate into the battery itself, and require that the electronic device be available and operable to provide an indication regarding the battery.

In some exotic applications such as aerospace vehicles, battery management functions may be incorporated into a battery system or packaging. Although space, weight, and power consumption may be factors of concern in such applications, the limitations imposed by the size constraints of a consumer battery are generally more demanding. Moreover, the cost for such circuits is typically not a concern in exotic applications. For low-cost consumer batteries, however, no such functionality is supported.

SUMMARY OF THE INVENTION

The present invention meets these and other needs with an indicating system incorporated into a battery container, the indicating system including an indicator controller that is responsive to the internal electrode voltage of the voltaic cell also within the battery container. The indicating system further includes an indicator that is controlled by the indicator controller. In some embodiments, an indicating system is provided that includes a pulse indicator and in other embodiments an analog indicator such as a bargraph.

In another aspect of the present invention, a consumer battery conforming to an outer dimension and a terminal voltage is provided with an indicating system that senses an electrode voltage of the voltaic cell, thereby controlling an indicator. The consumer battery can incorporate these features within a container having standardized dimensions.

In yet another aspect of the invention, a method for indicating a state of charge is provided that includes detecting an electrode voltage of a voltaic cell within a battery package containing a built-in integrated circuit, comparing the electrode voltage to a reference voltage, and indicating the state of charge when the electrode voltage falls below a reference voltage. More particularly, the method further provides boosting the terminal voltage of the battery in response to the electrode voltage declining below a threshold value.

In a further aspect of the invention, a battery is provided wherein a power sensing circuit senses the electrical charge stored within the battery and generates a conditioned voltage representative of the stored electrical charge to control an indicator exteriorly provided on the battery container.

In addition, a battery is provided wherein a manually activated actuator closes an internal latch to electrically couple internal electrodes of a voltaic cell to exteriorly provided battery terminals.

Furthermore, a battery including a power converter for boosting the terminal voltage of the battery is provided incorporating a power state machine with stop-step oscillator.

Each of these features, individually or in various combinations, are contemplated for enhancing consumer batteries. These and other advantages of the present invention will become apparent in the discussion below.

BRIEF DESCRIPTION OF THE DRAWINGS

The accompanying drawings, which are incorporated in and constitute a part of this specification, illustrate embodiments of the invention, and, together with the general description of the invention given above, and the detailed description of the embodiments given below, serve to explain the principles of the present invention.

DETAILED DESCRIPTION OF THE INVENTION

Figure 1:
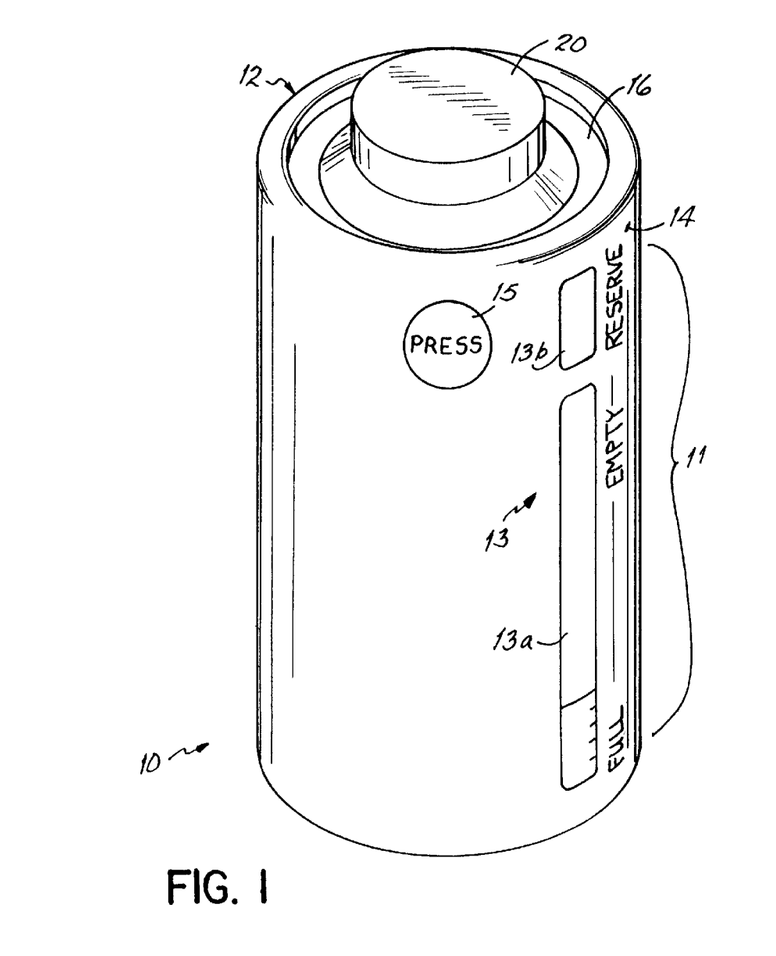
FIG. 1 is a perspective view of a battery having a built-in indicating system incorporated into a container of the battery, illustrating one type of indication in the form of a bargraph and also showing an interactive user control in the form of a tester actuator button.

Referring to FIG. 1, a battery 10 is shown having an indicating system 11 incorporated into a container 12, specifically a side wall 14 that is hereafter referred to as "label." The illustrative example shown is a cylindrical consumer battery 10 such as an AAAA, AAA, AA, C or D, although the indicating system 11 may be incorporated into other types of battery 10 such as prismatic and other multi-cell batteries.

The exteriorly visible portions of the first example of the indicating system 11 include an analog indicator 13 in the form of a primary voltaic cell bargraph 13a, labeled "FULL" and "EMPTY" at its limits. The analog indicator 13 also is shown including a reserve voltaic cell bargraph 13b labeled "RESERVE," although such a separate indication may be a calculated portion of a primary power source (not shown). In addition, multiple power sources (not shown) may be summed on the primary bargraph 13a without having a reserve bargraph 13b. The label 14 is also shown including a tester actuator button 15 that advantageously provides manual control of the indicating system 11 as will be described below, although it will be appreciated that embodiments of the present invention may be entirely automatic.

Figure 2:
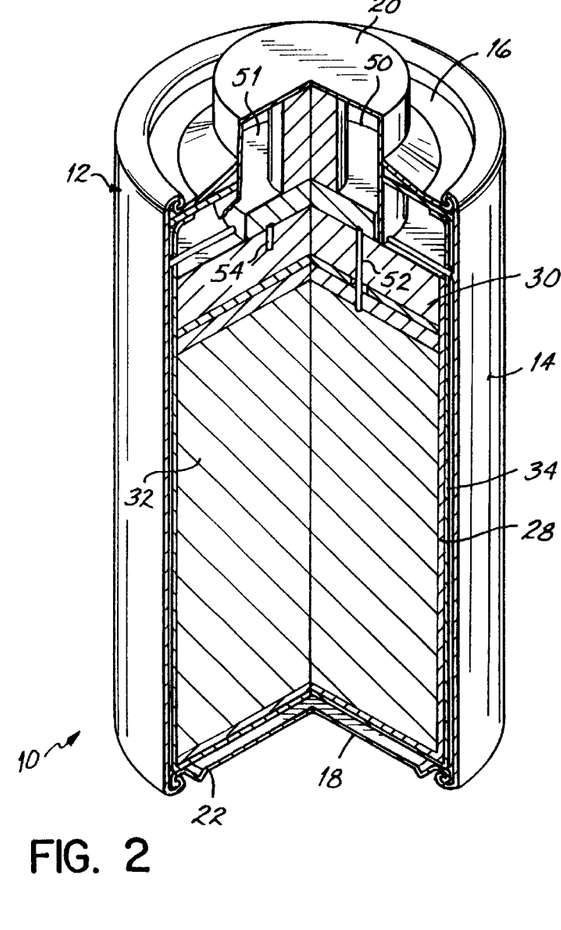
FIG. 2 is a cutaway view of the battery of FIG. 1 showing a built-in battery integrated circuit interposed between primary and reserve voltaic cell electrodes and the terminals of the battery.

Referring to FIGS. 1 and 2, the container 12 also includes a top cap 16 and a bottom cap 18 on opposing ends, with the exteriorly extended surface of the top cap 16 forming a positive terminal 20 and the exteriorly extended surface of the bottom cap 18 forming a negative terminal 22. The container 12 as shown encloses other portions of the battery 10 in that the other portions are surrounded by, or incorporated into, the label 14. It will be appreciated by those skilled in the art that other containers 12 may substantially enclose the other portions of the battery. For example, a cordless telephone handset may include a double-cell battery (not shown) wherein the two cells, having their own individual containers, are shrink wrapped together wherein portions of the individual containers are visible.

Referring to FIG. 2, a cutaway perspective view of the battery 10 of FIG. 1 is shown, illustrating several aspects of the present invention. The internal structure of the battery 10 is only generally shown, such as a primary voltaic cell 30, since the indicating system 11 is intended for a wide range of batteries. The primary voltaic cell 30 may be electrochemical, such as zinc-carbon, lithium, alkaline, nickel-cadmium, etc. Furthermore, the primary voltaic cell 30 may have other electrical power storage or generating means, such as electromechanical, solar, etc. Moreover, the primary voltaic cell 30 may comprise a plurality of discrete power sources. The primary voltaic cell 30 includes a positive primary voltaic cell electrode 32 (cathode) and a negative primary voltaic cell electrode 34 (anode), the negative electrode 34 being electrically grounded to the negative terminal 22. A separator 28 is disposed between the anode 34 and cathode 32. The positive primary voltaic cell electrode 32 is electrically coupled to a built-in battery integrated circuit 50 via a primary insulated positive conductor 52. The battery 10 of FIG. 2 is illustrative and may be modified for various energy sources as would be apparent to one skilled in the art. For example, additional structures such as current collectors (not shown) may be required.

The specific implementation shown in FIG. 2 includes a reserve voltaic cell 30' within the container 12. The reserve voltaic cell 30' includes a positive reserve voltaic cell electrode 32' electrically coupled to the built-in battery integrated circuit 50 via a reserve insulated positive conductor 54. The reserve voltaic cell 30' also includes a negative reserve voltaic cell electrode 34' that is electrically grounded to the negative terminal 22. Although the reserve voltaic cell 30' is shown of appreciable size, it will be appreciated that the reserve voltaic cell 30' may be of small size performing a short duration increase to battery service life upon either automatic or manual command. A manual switching may be advantageous to force a user to recognize that the battery 10 will soon be exhausted, especially in devices wherein the battery 10 is not readily visible for inspection of the label 14. In such an implementation, the label 14 may include an activating means, such as the tester actuator button 15, although the implementation discussed below contemplates an automatic switching. The intended small size of the reserve voltaic cell 30' allows for the primary voltaic cell 30 to be approximately the typical size of a consumer battery voltaic cell.

Battery service life is not significantly degraded by providing space for the indicating system 11 since the built-in battery integrated circuit 50 is partially enclosed by the positive terminal 20, which is wider than the typical battery top nipple, forming an elongate cavity 51 to enclose at least a portion of the built-in battery integrated circuit 50 and thus maintaining the height of the primary voltaic cell 30. Operative advantages of the illustrative circuits discussed below will also show mitigating power consumption features of the built-in battery integrated circuit 50 as well as power conversion capabilities that extract additional power from the battery 10, especially in the sub-one volt region, exceeding battery service life expectations. Consequently, automatic features of the built-in battery integrated circuit 50 often do not significantly degrade service life.

Figure 3:
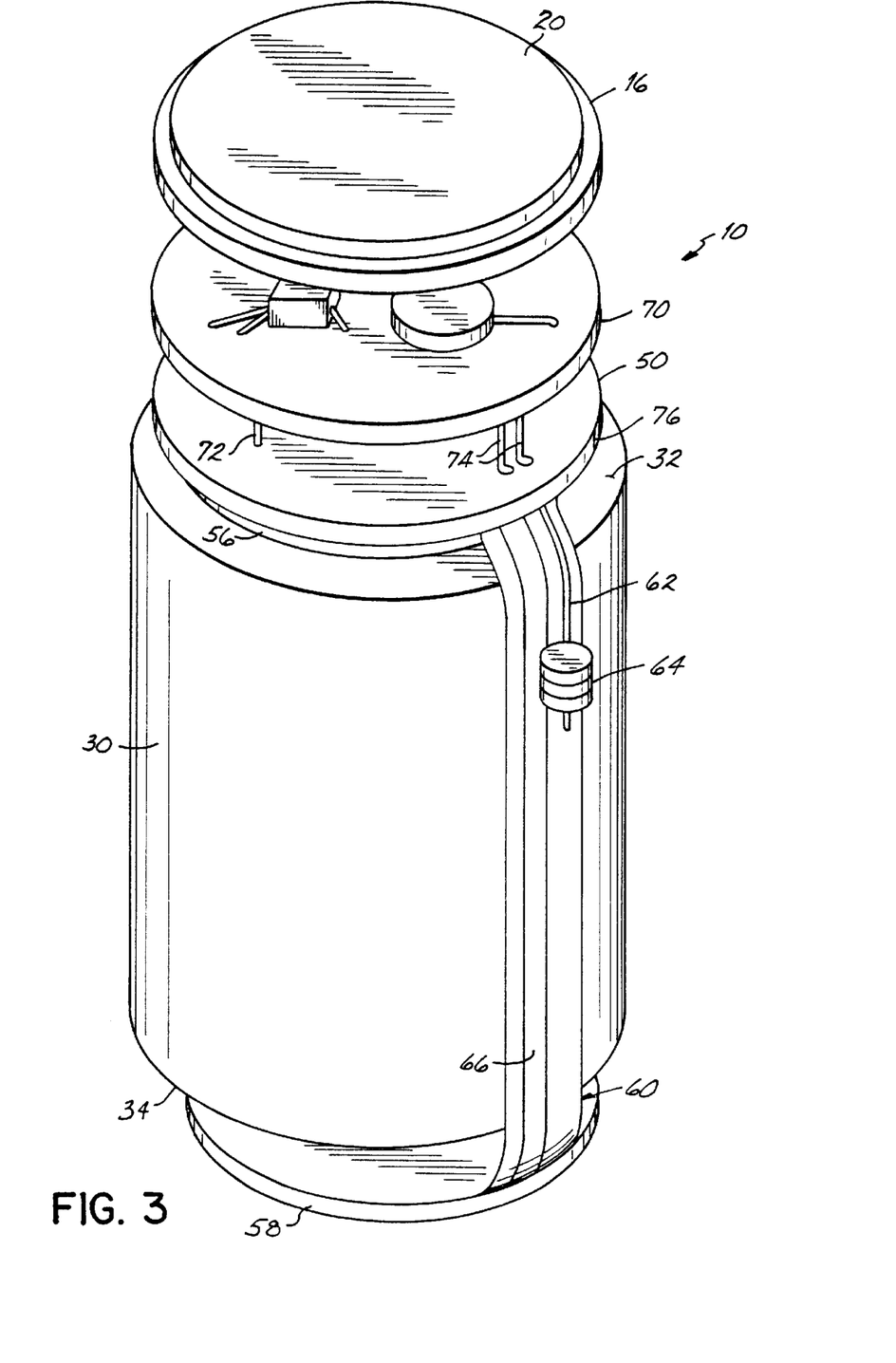
FIG. 3 is an exploded perspective view of a partially disassembled battery without a container, showing a snap-on built-in battery integrated circuit interfacing with a primary voltaic cell, and also showing another type of indication in the form of a pulse indicator such as a Light Emitting Diode (LED).

Referring to FIG. 3, a partially disassembled battery 10 is shown with the container 12 removed to illustrate a snap-on built-in battery integrated circuit 50' to the primary voltaic cell 30. Note that this implementation of the battery 10 does not include a reserve voltaic cell 30'. The illustration suggests a standard AA size consumer battery; however, such an assembly would be appropriate for a broad range of battery types, such as AAAA, AAA, C, D or prismatic cells. In some implementations, the top cap 16 is a false top bonded (in three points) to the label 14 of the battery 10. The snap-on built-in battery integrated circuit 50' operatively contacts the top cap 16 when the battery 10 is assembled. In the illustrative implementation, the snap-on built-in battery integrated circuit 50' is snap-on by having a positive conductive plate 56 contacting the positive primary electrode 32 and a negative conductive plate 58 contacting the negative primary electrode 34, with the positive and negative conductive plates 56, 58 physically coupled by a grounding strap 60, which may be a portion of the label 14. The grounding strap 60 also includes signal conductor 62 so that a pulse indicator 64, such as a Light Emitting Diode (LED) or alternatively a Liquid Crystal Display, may be powered by the built-in battery integrated circuit 50', the pulse indicator 64 being grounded to a grounding conductor 66 on the grounding strap 60. The pulse indicator 64 would be at least partially externally visible when the battery 10 is assembled.

The snap-on built-in battery integrated circuit 50' further includes an insulative layer 68 between the positive conductive plate 56 and a flexible circuit board 70. The grounding conductor 66 and positive conductive plate 56 are electrically coupled to the flexible circuit board 70 via lines 72, 74, respectively. A reserve voltaic cell 30' (not shown) may be snap-on incorporated in like fashion or in other fabrication techniques that would be apparent to one skilled in the art.

The snap-on built-in battery integrated circuit may be permanently adhered to other portions of the battery 10 by techniques including, but not limited to: (1) melting; (2) conductive adhesive; (3) clamping; (4) metal velcro-velcro connection; or (5) battery case assembly.

The flexible circuit board 70, comprising an array of conductors (not shown) bonded to a thin flexible dielectric film (or layer 76), e.g., polyester or polyimide such as 1 mil thick Kapton, is formed of a single layer or double-sided flexible circuit technique, although additional layers may also be used. In applications using flexible circuits, generally the circuit is designed and engineered specifically for the intended application. By disposing components and connections on a circuit board, the number of mechanical connections is reduced, which results in a lower noise and increases reliability. Also, the flexible circuit approach improves system efficiency so that clock speeds in the gigahertz range are achievable. The integrated circuit 50' electronic elements of the flexible circuit board 70 may advantageously be of silicon chip construction that may be surface mounted or die injected into the layer 76 for protection and more economical packaging. Reduced volume of the integrated circuit is an advantage. Flexible circuits thus provide high packaging density, dynamic flexing, bonding and contact sites for analog or digital devices, and reliability for complex geometry design. Being flexible and thin also allows the flexible circuit board 70 to be incorporated into other portions of the battery 10, including the label 14.

Figure 4:
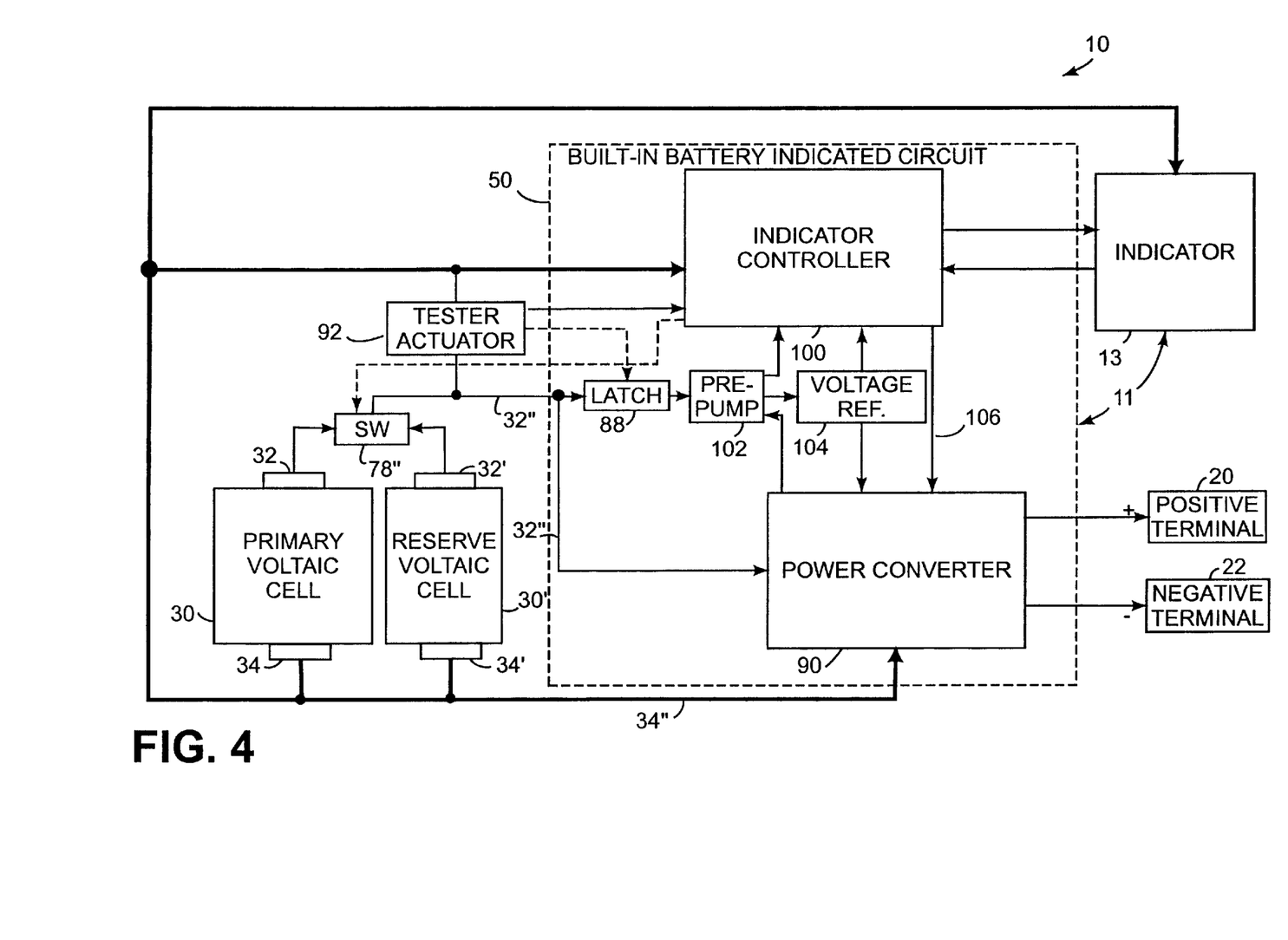
FIG. 4 is an electrical block diagram of the battery of FIG. 2 illustrating a built-in battery integrated circuit and its relationship to other components of the battery.

Referring to FIG. 4, an electrical block diagram for the battery 10 of FIGS. 1 and 2 is shown. The primary voltaic cell 30 is electrically in parallel with reserve voltaic cell 30' by having respective negative electrodes 34, 34' electrically coupled to a ground conductor 34" (or negative electrode) and by having respective positive electrodes 32, 32' tied to a reserve switch 78. The reserve switch 78 defaults to passing through voltage from the positive primary voltaic cell electrode 32, and, in response to a command from the built-in battery integrated circuit 50, changes state to pass through voltage from the positive reserve voltaic cell electrode 32'. The output of the reserve switch 78 forms a resultant positive electrode 32" that is electrically coupled to the built-in battery integrated circuit 50, and more specifically electrically coupled to both a latch 88 and a power converter 90 within the built-in battery integrated circuit 50.

The latch 88 is advantageously included to extend shelf life for the battery 10. Prior to first use, the latch 88 is initially open, preventing power from enabling the remainder of the built-in battery integrated circuit 50 with resultant power loss. An example of the latch 88 is a single-shot multi-vibrator.

The latch 88 is advantageously controlled by a tester actuator 92. The tester actuator 92 is electrically coupled to both the grounding conductor 34" and the resultant positive electrode 32". In response to actuation by a user, the tester actuator 92 provides an output to the latch 88 that will close the latch 88. Thereafter, the latch 88 remains closed. The tester actuator 92 also provides an output to the indicating system 11, as reflected in FIG. 4 by a connection shown to an indicator controller 100. This manual input to the indicating system 11 by the tester actuator 92 may be used to enable, or boot, the indicating system 11 that has no automatic enabling means, to enable or boot an indicating system in situations where the indicating system would otherwise be disabled (such as in high charge states), or to bypass the built-in battery integrated circuit 50 by providing a signal directly to the analog indicator 13, as described herein for FIG. 8, or in other applications that would be apparent to one skilled in the art.

Once the latch 88 is closed, the resultant positive electrode 32" is then electrically coupled to a pre-pump 102, a charge pump based power source intended to provide power to the other components of the built-in battery integrated circuit 50, such as the indicator controller 100 and a voltage reference 104, e.g., an integrated band-gap voltage reference. The voltage reference 104 outputs a steady voltage reference signal to the indicator controller 100 and the power converter 90.

The indicator controller 100 is electrically coupled to the analog indicator 13 and provides a forward control 106 signal to the power converter 90. The power converter 90 is electrically coupled to the positive terminal 20 and to the negative terminal 22 of the battery 10. In addition, the power converter 90 provides surge input to pre-pump 102 during start-up, as will be discussed in connection with FIG. 6.

For implementations of the present invention wherein the built-in battery integrated circuit 50 does not contain a power converter 90, having the latch 88 open to disable the pre-pump 102 disables the indicating system 11. In the implementation shown in FIGS. 4-6, the positive terminal 20 also receives no battery power in addition to the indicating system 11 being inoperative when the pre-pump 102 is disabled.

It will be appreciated by those skilled in the art that the built-in battery integrated circuit 50 performs a power sensing circuit function, in this instance by detecting electrode voltage as may be appropriate for some electrochemical voltaic cells. However, other power sensing approaches would be employed, for instance, where electrical power is stored in the form of an electromagnetic field, a volume of fuel, or kinematic energy. Many forms of energy sources are candidates for such indicating systems 11 since the indicator 13 need not be powered directly by the electrode voltage but is instead powered by a conditioned voltage.

Figure 5:
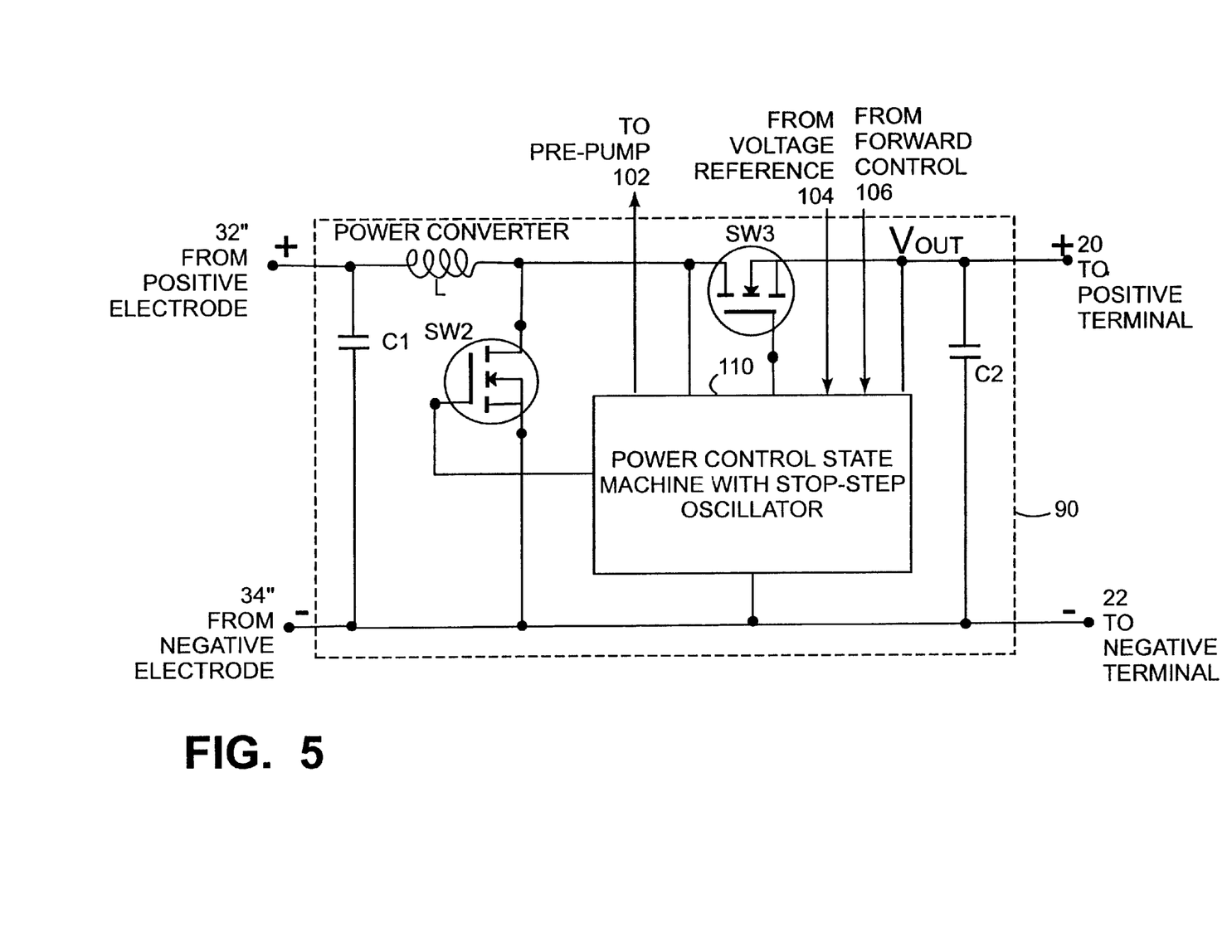
FIG. 5 is one implementation of the power converter referenced in FIG. 4.

Referring to FIG. 5, an implementation of the power converter 90 of FIG. 4 is shown in more detail, and includes an input capacitor C1, inductor L, MOSFET switch 2 ("SW2"), MOSFET switch 3 ("SW3") (which would typically be a Schottky diode for power converter 90 intended to boost voltage), output capacitor C2, and power control state machine with stop-step oscillator 110. The power converter 90 receives an input voltage from the resultant positive and negative electrodes 32", 34", across which input capacitor C1 is connected to provide input stability, especially if the voltaic cells 30, 30' are distant from the power converter 90. A typical capacitor C1 may be of tantalum ether construction or a polymer capacitor. The power converter 90 provides an output voltage to the positive and negative terminals 20, 22, across which the output capacitor C2, which may be a low ESR type of tantalum capacitor or a polymer or other type of capacitor that has low equivalent series resistance (ESR). It will be appreciated that the power converter 90 may be formed within a package having capacitance to provide the output capacitor C2.

The inductor L has a first end connected to the positive electrode 32" and a second end connected to the drain of SW2 and the drain of SW3. The collector and substrate of SW2 are connected to the negative electrode 34". The power control state machine with stop-step oscillator 110 has connections to the gate and drain of SW2; the gate of SW3; the negative electrode 34"; the drain, substrate and collector of SW3, as well as inputs external to the power converter 90 including the aforementioned pre-pump 102, voltage reference 104, and forward control 106, which will be discussed in greater detail with reference to FIG. 6.

Figure 6:
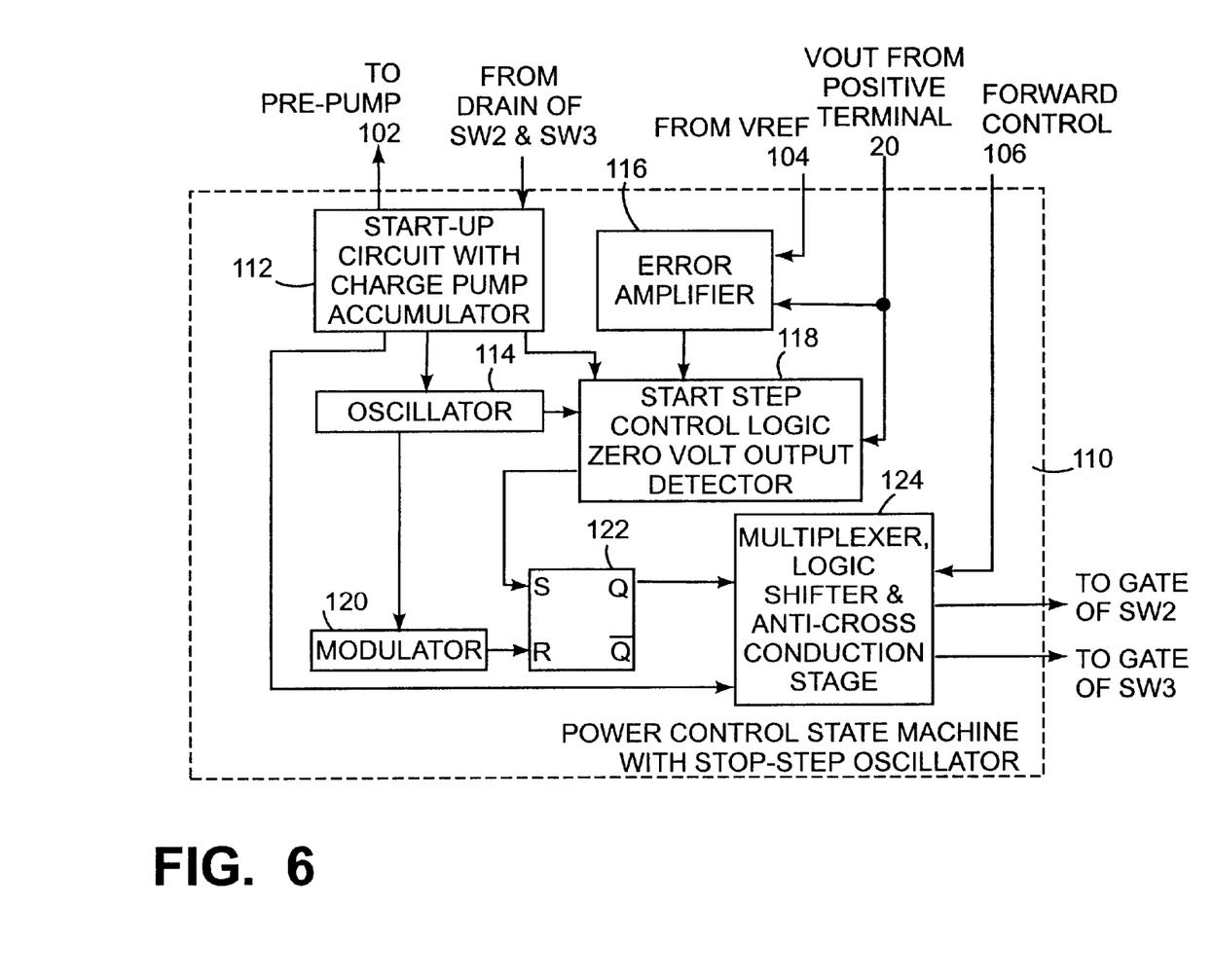
FIG. 6 is a specific implementation of the power control state machine with stop-step oscillator of FIG. 5.

Referring to FIG. 6, an implementation of the power control state machine with stop-step oscillator 110 of FIG. 5 is shown including a start-up circuit with charge pump accumulator 112, oscillator 114, error amplifier 116, start step control logic zero volt output detector 118, modulator 120, SR flip-flop 122, and multiplexer, logic shifter & anti-cross conduction stage 124. Each component of the power control state machine with stop-step oscillator 110 is also biased in part by reference to the negative electrode 34".

It is desirable that power converter 90 be able to handle a surge in demand from a load (not shown) attached to the battery 10 even when the battery 10 is not fully charged, so that positive electrode voltage passes through inductor L, goes to the start-up circuit with charge pump accumulator 112, which in turn powers the oscillator 114, start step control logic zero volt output detector 118, and multiplexer, logic shifter and anti-cross conduction stage. Otherwise, the power control state machine with stop-step oscillator 110 may act unpredictably if demands result in the built-in battery integrated circuit being inadequately powered.

The oscillator 114 provides a stable frequency for clocking components of the power control state machine with stop-step oscillator 110, specifically the start step control logic zero volt output detector 118 and the modulator 120.

The error amplifier 116 compares a Vout signal from the positive terminal 20 with the reference voltage from the voltage reference 104, providing an error signal to the start step control logic zero volt output detector 118.

The start step control logic zero volt output detector 118 modulates a duty cycle signal to the SR flip-flop 122 in correlation to the error signal, increasing the duty cycle a step when the error signal is positive and decreasing the duty cycle signal a step when the error signal is negative. In addition, the start step control logic zero volt output detector 118 receives the Vout signal from the positive terminal 20 for the purpose of detecting a zero voltage (i.e., shorted battery condition) so that the battery output may be decreased by decreasing the duty cycle signal. Start Step control logic stop controller performs a long-discontinuous mode for light loads so that the efficiency is not jeopardized.

The SR flip-flop 122 generates a driving signal by having the duty cycle signal at the S input and having the modulator 120 provide a modulator signal of the same clock rate as the oscillator 114 to the R input.

The multiplexer, logic shifter & anti-cross conduction stage 124 receives the driving signal for preparing an output signal to fully drive the gates of SW2 and SW3 into the saturation region. Anti-cross conduction stage dynamically adjusts the dead-time between the gates based on forward control signal and Vout signal.

Figure 7:
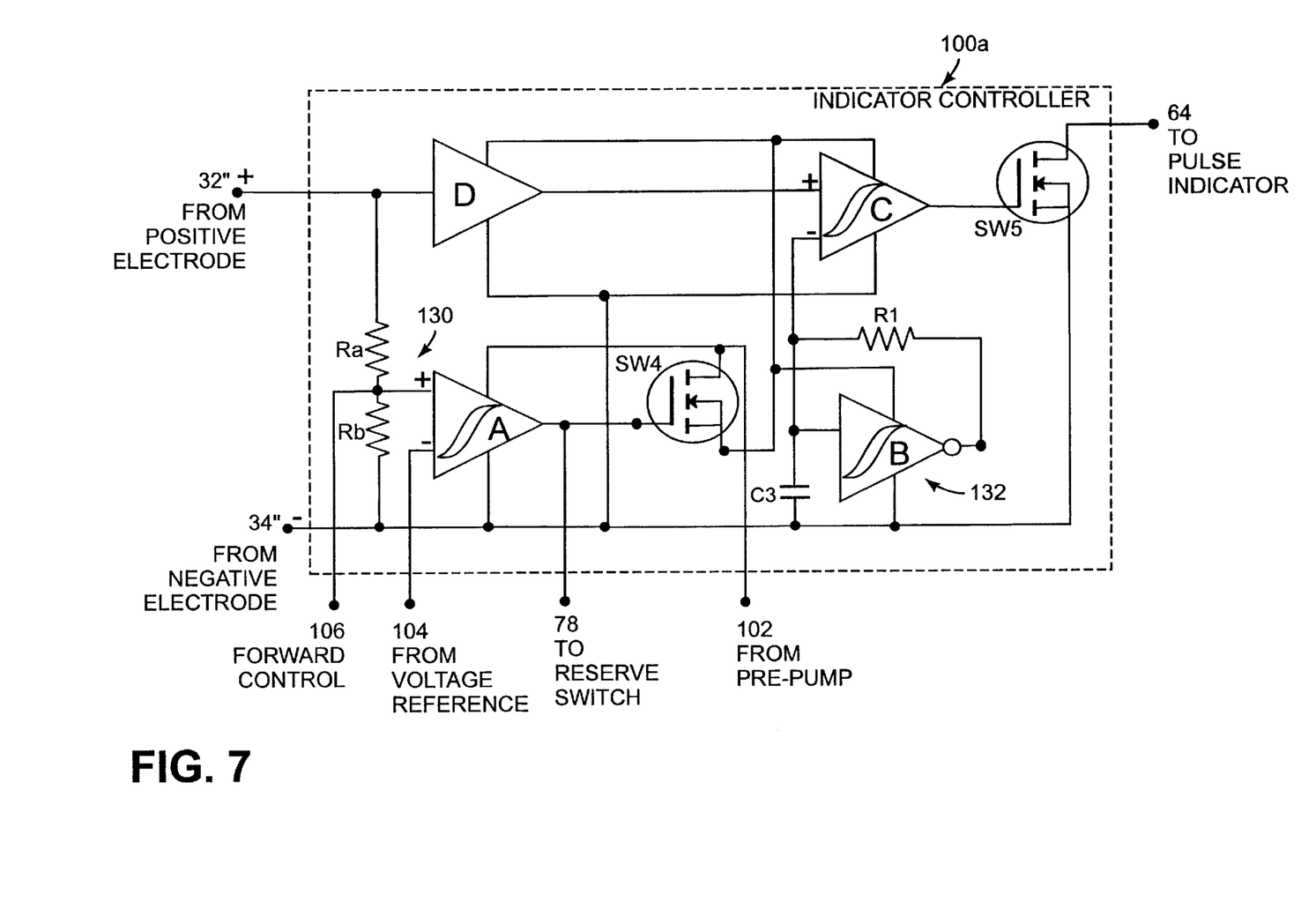
FIG. 7 is a one implementation of the indicator controller referenced in the built-in battery integrated circuit of FIG. 4, providing control for a pulse type indicator, such as a Light Emitting Diode (LED) indicator or a Liquid Crystal Diode (LCD) indicator.

Referring to FIG. 7, one implementation of the indicator controller 100a referenced in FIG. 4 is shown configured for a pulse indicator 64 as shown in FIG. 3. The indicator controller 100a comprises a voltage threshold detector 130 that monitors electrode voltage, outputting a threshold signal when the voltaic cell falls below a voltage threshold for a predetermined period of time. The threshold signal enables or boots the remaining portions of the indicating system 11 so that a pulse indication is provided.

The electrode voltage being sensed by the voltage threshold detector 130 may fluctuate due to changes in a load (not shown) to the battery 10. For example, a large current spike for a surge interval such as approximately 100 ms duration, with a corresponding drop in electrode voltage, is typical for many devices, especially during start-up. In order to prevent a false alarm of the indicating system 11, the voltage threshold detector 130 comprises a differential-input hysteretic Schmitt Trigger A which compares the positive electrode 32" to the reference voltage, such as 1.4 V, from the voltage reference 104. The electrode voltage is sensed from a voltage divider of resistors Ra and Rb, wherein a first end of resistor Ra and a first end of resistor Rb are electrically coupled to the positive input to hysteretic Schmitt Trigger A, and wherein a second end of resistor Ra is electrically coupled to positive electrode 32" and a second end of resistor Rb is electrically coupled to the negative electrode 34". The juncture of resistors Ra and Rb is also defined as the source for the aforementioned forward control 106 provided to the power converter 90. The values of Ra and Rb are chosen such that power dissipation is low across the series combination of Ra and Rb and such that the desired turn-on voltage for the indicating system 11 is achieved when compared to the reference voltage.

The output of the hysteretic Schmitt Trigger A is connected to the gate of a MOSFET switch SW4, whose drain is powered by the pre-pump 102. The substrate and collector of switch SW4 are electrically coupled to bias the remaining portion of indicator controller 100a, specifically a single-input inverted hysteretic Schmitt Trigger B, a differential input hysteretic Schmitt Trigger C, and an operational amplifier (Op Amp) D. Op Amp D receives an input from the positive electrode 32" and provides a buffered positive electrode voltage as an output to the positive input of differential-input hysteretic Schmitt Trigger C. The negative input of Schmitt Trigger C is electrically coupled to the input of inverted Schmitt Trigger B. A resistor R1 has a first end connected between the input and the output of inverted Schmitt Trigger B. Also, a capacitor C3 is connected between the input of inverted Schmitt Trigger B and the negative electrode 34". The values of resistor R1 and C3 are chosen such that the combination with Schmitt Trigger B forms a low frequency oscillator 132, providing a pulse indicator frequency input to the negative input of Schmitt Trigger C. As the buffered positive electrode voltage declines at the positive input to Schmitt Trigger C, the output pulse train from Schmitt Trigger C has an increasing duty cycle, which is used to control the gate of a MOSFET switch 5. The substrate and collector of MOSFET switch 5 are connected to the negative electrode 34" and the drain of MOSFET switch 5 is connected to pulse indicator 64. Switch SW5 is a high impedance switch so that it can be directly connected to the pulse indicator 64, such as an LED or Liquid Crystal Display (LCD), without the need for a current limiting resistor.

Figure 8:
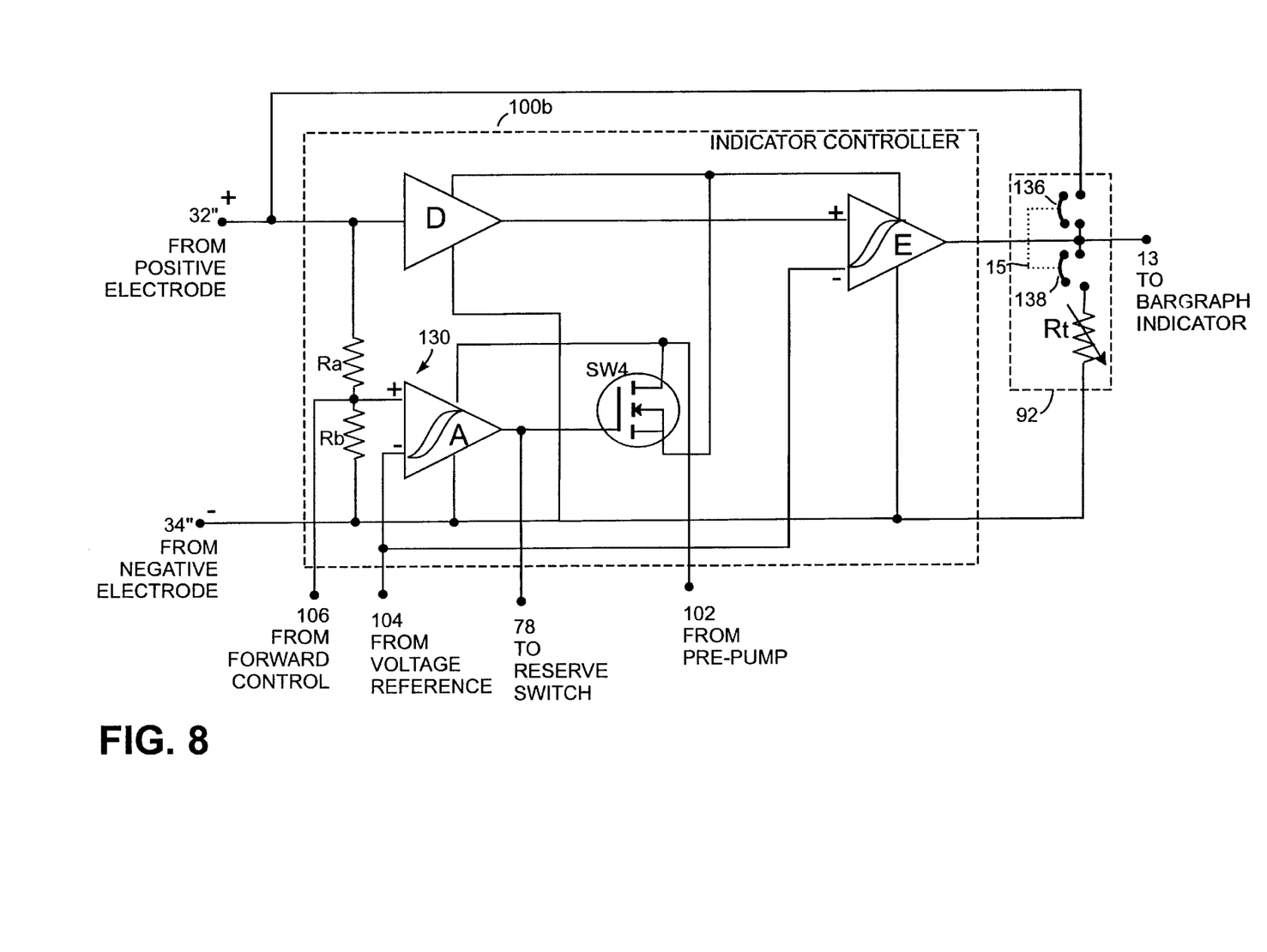
FIG. 8 is another implementation of the indicator controller shown as a major component of the built-in battery integrated circuit of FIG. 4, providing control for a bargraph type indicator and providing for press-to-test indication.

Referring to FIG. 8, a second indicator controller 100b is shown for an analog indicator, such as the analog indicator 13 of FIG. 1. The discussion above in FIG. 7 is applicable as well in FIG. 8 for the Schmitt Trigger A, switch 4 (SW4), and Op Amp D. Rather than having a low frequency oscillator 132, instead the buffered positive electrode voltage from Op Amp D is electrically coupled to the positive input of a differential-input hysteretic Schmitt Trigger E. The negative input to the differential-input hysteretic Schmitt Trigger E is electrically coupled to the voltage reference 104. The output of the differential-input hysteretic Schmitt Trigger E is electrically coupled to the analog indicator 13.

Also shown in FIG. 8 is another implementation of the tester actuator 92 referenced in FIG. 4. Tester actuator 92 is directly connected to the bargraph indicator 13 at the output of the indicator controller 100b (i.e., output of Op Amp E). Specifically, a tester actuator button 15 (FIG. 1) electrically closes a first contact 136 and a second contact 138. The first contact 136 electrically couples the positive electrode 32" to the bargraph indicator 13. The second contact electrically couples the bargraph indicator 13 to a first end of a resistor Rt, while a second end of resistor Rt is electrically coupled to the negative electrode 34". Thus, in a case when the battery 10 is out of its socket or when no external load is on the battery 10, the tester actuator 92 imposes an optimal artificial load (resistor Rt) so that electrode voltage will reflect the state of charge of the battery 10. The resistor Rt may be printed on the label 14 or integrated into the flexible circuit board 70 and trimmed to the appropriate calibration for a specific bargraph indicator.

Referring to both FIGS. 7 and 8, advantageously, the output of the hysteretic Schmitt Trigger A is also connected to the reserve switch 78 so that when a low electrode voltage is sensed, the reserve voltaic cell 30' is utilized.

Figure 9:
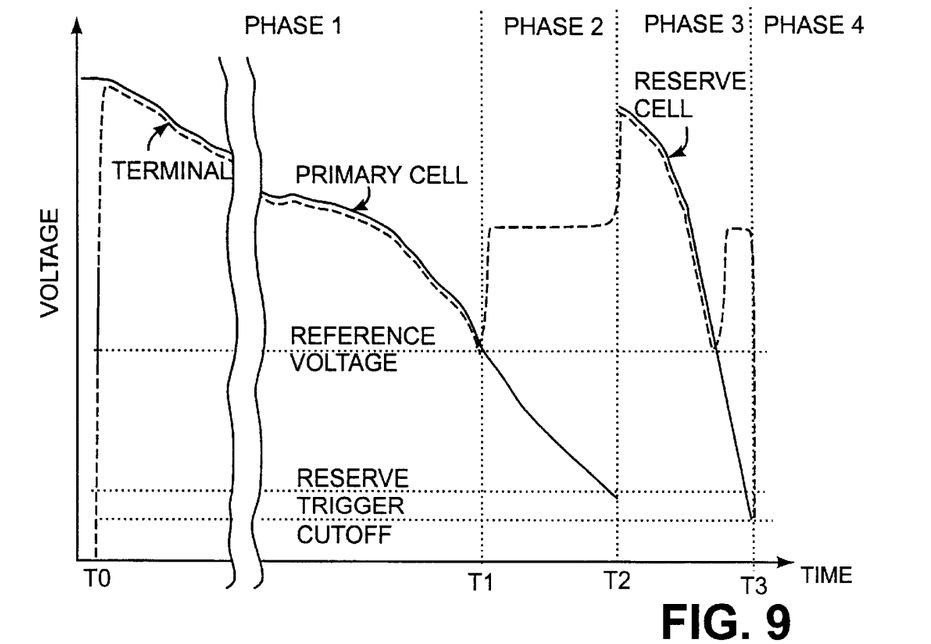
FIG. 9 is an illustrative voltage plot over time for the battery of FIGS. 2 & 4 wherein the battery voltage is initially that of the primary voltaic cell voltage that declines first below a reference voltage and finally below a cutoff voltage, at which time the battery voltage is switched to a reserve voltaic cell voltage.

Referring to FIG. 9, a voltage plot illustrates operation of a built-in battery integrated circuit such as shown in FIG. 4. In Phase 1, immediately after manufacture, the battery 10 has an internal primary cell electrode voltage ("Primary Cell") fully charged that is electrically disconnected from the built-in battery integrated circuit 50, and preferably also from the battery terminals 20, 22 ("Terminal"). The latter isolation of the terminals 20, 22 not only decreases likelihood of power leakage during extended shelf time but provides for safety. Lithium batteries, for instance, may heat and explode during rapid discharge, such as if the terminals 20, 22 were inadvertently shorted during storage.

At time T0, the primary cell electrodes 32, 34 are electrically coupled to the terminals 20, 22, respectively, such as by latch 88, whereby power is also provided to at least a portion of the built-in battery integrated circuit 50, such as the pre-pump 102, voltage reference 104, and the Schmitt Trigger A. As the electrode voltage is above a reference voltage, the terminal voltage tracks the primary voltaic cell voltage through the remainder of Phase 1.

Figure 10:
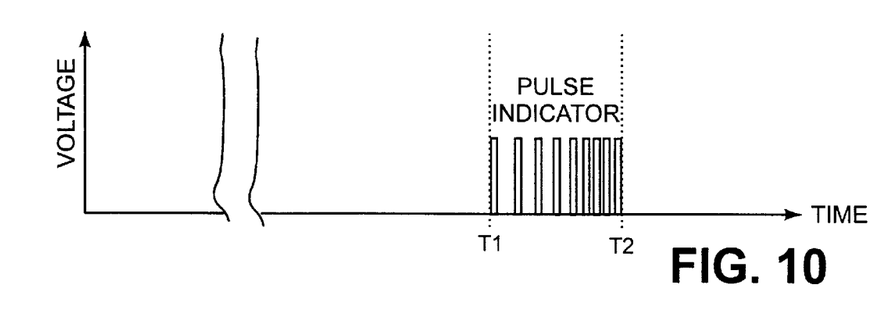
FIG. 10 is an illustrative voltage plot for the built-in battery integrated circuit of FIGS. 7 & 9 emitting an increasing frequency pulse indication when the primary voltaic cell voltage declines from the reference voltage to the cutoff voltage.

At time T1, Phase 2 begins with the electrode voltage going below the reference voltage, thus causing both the power converter 90 and indicating system 11 to activate automatically. Thus, the electrode voltage continues to decline while the terminal voltage is held by the power converter 90 relatively constant at a higher voltage. Examples of the indicating system 11 are discussed below with respect to FIGS. 10 and 11.

Absent any reserve voltaic cell, the electrode voltage will decrease until a cutoff voltage, such as 0.7 V, is reached, whereupon the built-in battery integrated circuit no longer has sufficient voltage to operate. Depending upon the implementation, the terminal voltage would thus either resume tracking the electrode voltage or would be electrically disconnected from the electrodes 32, 34.

FIG. 9, however, shows an implementation including a reserve voltaic cell 30'. At time T2, the electrode voltage reaches a reserve trigger voltage, that is higher than the cutoff voltage, and the reserve voltaic cell 30' begins supplying power to the terminals 20, 22. During Phase 3, the reserve voltaic electrode voltage declines in a fashion similar to that previously discussed for the primary voltaic cell voltage, although generally faster, so the power converter 90 and indicating system 11 may be triggered again. At time T3, the reserve voltaic cell electrode voltage reaches the cutoff voltage, thereafter in Phase 4 the built-in battery integrated circuit 50 is deactivated.

Referring to FIG. 10, Phase 2 for a pulse indicator 64, such as described above for FIGS. 8 and 10, is shown wherein a pulse train commences at T1 and continues to increase in frequency until time T2, the resulting flashes of the pulse indicator 64, such as an LED, alerting a user to impending battery failure.

Figure 11:
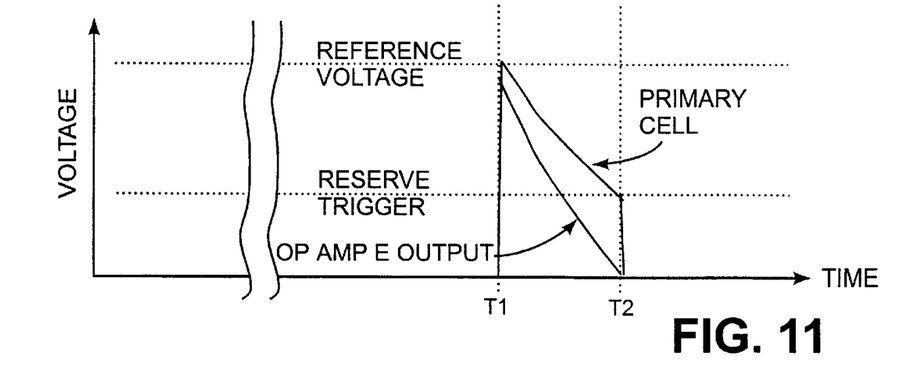
FIG. 11 is an illustrative voltage plot for the built-in battery integrated circuit of FIGS. 8 & 9 wherein a buffered primary voltaic cell voltage is converted to a calibrated signal corresponding to the corresponding range of the bargraph indicator for the time when the primary voltaic cell voltage is between the reference voltage and cutoff voltage.

Referring to FIG. 11, Phase 2 for a bargraph indicator 13, such as described above for FIGS. 9 and 10, is shown, wherein the electrode voltage (i.e., the buffered Op Amp E output) is converted by the Op Amp E to a corresponding range for the bargraph indicator 13. Such calibration may accommodate nonlinearities in gauging electrode voltage to state of charge as well as the operable input range of the analog indicator 13.

The invention in its broader aspects is therefore not limited to the specific details, representative apparatus and methods, and illustrative examples shown and described. Accordingly, departure may be made from such details without departing from the spirit or scope of applicants' general inventive concept.

For example, although a power converter 90 is advantageously depicted as a part of the built-in battery integrated circuit 50, the indicating system 11 may be incorporated into a battery 10 wherein voltaic cell voltages are directly supplied to the battery terminals 20, 22. Alternatively, a power converter 90 may regulate terminal voltage full-time, including increasing or decreasing voltage across electrodes 32, 34.

As another example, although proportions and structures typical of an electrochemical voltaic cell 30 are illustrated, the built-in battery integrated circuit 50 may be applied to a broad range of voltaic cells 30, including solar, hybrid, electromechanical, etc. Moreover, a battery 10 may have any number of primary voltaic cells 30 and/or reserve voltaic cells 30' with such cells 30, 30' in serial or parallel electrical combination.

As an additional example, the label 14 may incorporate various types of indications in addition to, or place of, an analog indicator such as the bargraph indicator 13 or the pulse indicator 64. For example, the state of charge information may be converted to a corresponding digital representation indicating a number or percentage. Furthermore, the state of charge information may be further converted to a corresponding time measurement, such as time remaining until the battery 10 is discharged, such calculations based on an average, instantaneous, or predetermined rate of discharge.

As yet another example, the description herein provides for a battery 10 with a tester actuator button 15 that advantageously provided for a plurality of functions, such as initially enabling the built-in battery integrated circuit 50 to extend shelf life and manually activating the indicating system 11 to confirm state of charge when otherwise the indicating system would be inactive. Other implementations of the battery 10 may have no such interface or assign fewer functions, such as having no latch 88 and thus the built-in battery integrated circuit 50 would be activated automatically.

As yet a further example, the tester actuator 92 may activate the built-in battery integrated circuit 50, rather than connecting an electrode voltage to the bargraph indicator 13 and connecting a calibrated resistor Rt between the bargraph indicator and ground.

As another example, the indicating system 11 may include an audio communicator in place of or in addition to a visual indication. Thus, an audible tone modulated in frequency or duration may convey information as to impending battery failure.

It will be appreciated that the latch 88 which initially disables the built-in battery integrated circuit 50 may be omitted, allowing the battery 10 to be filly operable. Alternatively, the latch 88 may also interrupt the resultant positive electrode 32" electrical coupling to the power converter 90 and hence to the positive terminal 20. Although this requires a manual step by a user to render the battery 10 operable, this inconvenience would be warranted if extended shelf life is desired. In addition, some voltaic cells such as lithium batteries become unsafe during rapid discharge. Having the positive terminal 20 initially electrically disengaged provides a measure of safety from shorting the battery against an inadvertent load, such as dropping the battery in a puddle. For implementations of the present invention without a power converter 90, the latch 88 would thus directly couple to the positive terminal 20 to achieve the same safety enhancement.

What is claimed is:

1. A battery comprising:

a primary voltaic cell including a positive electrode and a negative electrode, said primary voltaic cell storing electrical charge resulting in an electrode voltage across said positive and said negative electrodes;

an indicating system including an indicator and an indicator controller, said indicator controller interposed between said electrodes and said indicator, said indicator controller responsive to said electrode voltage for controlling said indicator;

a container substantially enclosing said primary voltaic cell and said indicating system; and, wherein said indicator controller includes a voltage threshold detector electrically coupled to said electrodes, said voltage threshold detector responsive to said electrode voltage declining to a voltage threshold whereupon said voltage threshold detector activates said indicating system to thereby activate said indicator.

2. The battery of claim 1 wherein said indicating system includes a voltage reference and wherein said voltage threshold detector includes a trigger coupled to said electrodes and coupled to said voltage reference.

3. The battery of claim 1 wherein said voltage threshold detector comprises a differential-input hysteretic Schmitt trigger having a first and a second input and a trigger output, said first input electrically coupled to said electrode voltage and said second input electrically coupled to a voltage divider biased by said voltage reference, said voltage divider generating a predetermined voltage threshold, said output controlling battery power to the remaining portion of said indicating system.

4. The battery of claim 1 wherein said indicator controller further includes a slow pulse oscillator electrically enabled by said voltage threshold detector and controlling said indicator.

5. The battery of claim 4 wherein said indicator includes a pulse indicator.

6. The battery of claim 5 wherein said pulse indicator comprises one of a Light Emitting Diode and a Liquid Crystal Display.

7. The battery of claim 1 further including a reserve switch and a reserve voltaic cell substantially enclosed by said container, said reserve switch interposed between said primary voltaic cell and said reserve voltaic cell and controlled by said indicating system to selectively augment the electrical charge of said primary voltaic cell.

8. The battery of claim 7 wherein said reserve voltaic cell includes a positive electrode and a negative electrode, said reserve negative electrode electrically coupled to said primary negative electrode, and wherein said reserve switch switchably connects said primary positive electrode and said reserve positive electrode to said indicating system.

9. The battery of claim 1 wherein said indicating system further includes a positive conductor, a negative conductor, and a grounding strap, and wherein said indicator controller comprises a flexible circuit board, said positive conductor electrically coupled with said positive electrode of said primary voltaic cell and said negative conductor electrically coupled with said negative electrode of said primary voltaic cell, said flexible circuit board electrically coupled to said positive conductor and to said grounding strap, said grounding strap electrically coupled to said negative conductor, wherein said indicator is exteriorly placed on said container, said container further including a positive terminal and a negative terminal, said flexible circuit board electrically coupled to said positive terminal, and said negative terminal electrically coupled to said negative electrode, negative conductor, and said ground strap;

wherein an artificial load resistor is provided on said flexible circuit board to provide a representative measurement of said electrode voltage for determining said voltaic cell storage charge.

10. The battery of claim 9 wherein said positive terminal comprises a top cap sized and configured to enclose a portion of said flexible circuit board.

11. The battery of claim 1 further including a tester actuator exteriorly placed of said container, said tester actuator responsive to manual input for electrically coupling said electrodes of said primary voltaic cell to a first end of a test resistor having a second end electrically coupled to said negative electrode, said tester actuator further responsive to manual input for activating said indicator.

12. The battery of claim 11 wherein said tester actuator switchably couples said positive electrode to said indicator in response to manual input for activating said indicator.

13. The battery of claim 11 wherein said indicator includes a bargraph indicator.

14. The battery of claim of claim 11 wherein said container further includes a positive terminal electrically coupled to said indicating system and a negative terminal electrically coupled to said negative electrode, said battery further including a latch electrically interposed between said electrodes and said terminals and closably responsive to said tester actuator.

15. The battery of claim 14 wherein said latch comprises a one-shot multivibrator.

16. The battery of claim 1 further including a positive terminal and a negative terminal and wherein said indicating system includes a power converter electrically interposed between said electrodes and said terminals for converting the electrode voltage at said electrodes to a terminal voltage at said terminals, said battery further including a latch electrically interposed between said electrodes and said terminals and closably responsive to said tester actuator wherein said electrode voltage is increased in response to detecting said electrode voltage declining below a threshold level.

17. The battery of claim 16 wherein said power converter includes a power control state machine with stop-step oscillator for selectively increasing the terminal voltage in response to the electrode voltage declining to a threshold.

18. A battery as in claim 1 further comprising:
an indicating system comprising an indicator and an indicator controller, said indicator controller measuring voltage across said positive and said negative electrodes when said battery is connected to an external load.

19. A battery as in claim 1 further comprising:
an indicating system comprising an indicator and an indicator controller, said indicator controller measuring voltage across said positive and said negative electrodes using an internal artificial load.

20. A battery having a predetermined outer dimension substantially equal to a consumer battery and a terminal voltage, the battery comprising:

a primary voltaic cell including a positive electrode and a negative electrode, said primary voltaic cell storing electrical charge resulting in an electrode voltage across said positive and said negative electrodes;

an indicating system including an indicator and an indicator controller, said indicator controller interposed between said electrodes and said indicator, said indicator controller responsive to said electrode voltage for controller said indicator; and, a container substantially enclosing said primary voltaic cell and said indicating system, said container conforming to the predetermined outer dimensions of the consumer battery, said container including a positive terminal and a negative terminal providing the terminal voltage.

21. A method for indicating with a built-in integrated circuit a state of charge of a battery having a voltaic cell, the method including:

detecting with said built-in integrated circuit an electrode voltage of said voltaic cell indicative of a state of charge of said voltaic cell;

comparing said electrode voltage to a reference voltage;

indicating the state of charge of said voltaic cell in response to said electrode voltage declining below the reference voltage;

measuring an electrode voltage of said voltaic cell while connected to an outside load; and, measuring an electrode voltage of said voltaic cell when it is connected to an internal artificial load.

22. The method of claim 21 further including:
boosting the electrode voltage in response to detecting the electrode voltage declining below a threshold.

23. A battery comprising:
a primary voltaic cell including a positive electrode and a negative electrode, the cell storing electrical charge resulting in an electrode voltage across the positive and negative electrodes;

a power sensing circuit operatively connected across the positive and negative electrodes to sense the electrode voltage, said circuit generating a conditioned voltage representative of the stored electrical charge;

a battery container enclosing the voltaic cell and the power sensing circuit, the container including an indicator operatively coupled to the power sensing circuit for generating an indication exterior to the container in response to the conditioned voltage; and, wherein said indicator controller includes a voltage threshold detector electrically coupled to said electrodes, said voltage threshold detector responsive to said electrode voltage declining to a voltage threshold whereupon said voltage threshold detector activates said indicating system to thereby activate said indicator.

24. A battery as in claim 23 further comprising:
an internal artificial load connected across said positive and said negative electrodes to generate an electrode voltage representative of said stored electrical charge.

25. A consumer battery having a standard outer dimension and standard nominal terminal voltage, the consumer battery comprising:

a voltaic cell including a positive electrode and a negative electrode, the voltaic cell storing electrical charge resulting in an electrode voltage across the positive and negative electrodes;

a battery container enclosing the voltaic cell and including a positive terminal and a negative terminal;

a latch configured to electrically couple said electrodes to said terminals; and an actuator exteriorly placed in said battery container and operably coupled to said latch to command said latch to close in response to manual activation by a user.

26. The consumer battery of claim 25 wherein said latch comprises a one-shot latch remaining closed after first actuation.

27. A battery comprising:

a voltaic cell including a positive electrode and a negative electrode, said voltaic cell storing electrical charge resulting in an electrode voltage across said positive and said negative electrodes;

an indicating system including a pulse indicator and an indicator controller, said indicator controller interposed between said electrodes and said pulse indicator, said indicator controller responsive to said electrode voltage for controlling said pulse indicator with a pulse rate indicative of the state of charge of the voltaic cell; and a container substantially encompassing said voltaic cell and said indicating system.

28. A battery comprising:

a primary voltaic cell including a positive electrode and a negative electrode, the cell storing electrical charge resulting in an electrode voltage across the positive and negative electrodes;

a battery container enclosing the voltaic cell, the container including a positive terminal and a negative terminal; and a power converter within the container, said power converter electrically coupled between said electrodes and said terminals for boosting the electrode voltage to a terminal voltage across said terminals, the power converter including a first switch electrically coupled across said electrodes, a second switch electrically coupled to said positive electrode and said positive terminal, and a power control state machine with stop-step oscillator operatively coupled to said first switch and said second switch.

* * * * *